(12) United States Patent
Tsukada et al.

(10) Patent No.: US 8,722,285 B2
(45) Date of Patent: May 13, 2014

(54) PELLICLE FOR LITHOGRAPHY

(75) Inventors: Junichi Tsukada, Annaka (JP); Toru Shirasaki, Annaka (JP)

(73) Assignee: Shin-Etsu Chemical Co., Ltd, Tokyo (JP)

( * ) Notice: Subject to any disclaimer, the term of this patent is extended or adjusted under 35 U.S.C. 154(b) by 0 days.

(21) Appl. No.: 13/455,345

(22) Filed: Apr. 25, 2012

(65) Prior Publication Data

US 2012/0276473 A1 Nov. 1, 2012

(30) Foreign Application Priority Data

Apr. 26, 2011 (JP) .................................. 2011-098074

(51) Int. Cl.
*G03F 1/00* (2012.01)
(52) U.S. Cl.
USPC .............................................. 430/5; 428/14
(58) Field of Classification Search
USPC .............................................. 430/5; 428/14
See application file for complete search history.

(56) References Cited

U.S. PATENT DOCUMENTS

| 7,901,841 | B2 | 3/2011 | Shirasaki |
| 7,914,952 | B2 | 3/2011 | Shirasaki et al. |
| 2008/0063952 | A1 | 3/2008 | Shirasaki et al. |
| 2009/0029269 | A1 | 1/2009 | Shirasaki et al. |
| 2009/0286169 | A1 | 11/2009 | Shirasaki |
| 2011/0027700 | A1* | 2/2011 | Shirasaki ........................ 430/5 |
| 2012/0122024 | A1 | 5/2012 | Shirasaki et al. |

FOREIGN PATENT DOCUMENTS

| EP | 1 898 261 | 3/2008 |
| EP | 2 017 671 | 1/2009 |
| EP | 2 120 093 | 11/2009 |
| EP | 2 280 307 | 2/2011 |
| EP | 2 455 809 | 5/2012 |
| JP | 2009-276504 A | 11/2009 |
| TW | 200947115 A1 | 11/2009 |

OTHER PUBLICATIONS

European Search Report for EP-12 16 2067 dated Jul. 20, 2012.
Zhou, N. et al., "Effect of Pellicle Frame and Adhesive Material on Final Photomask Flatness," Proc. of SPIE, 2009, vol. 7379, pp. 737909-1-737909-8.
Taiwan Office Action dated Dec. 12, 2013 (pp. 1-3).
English Translation Abstract of JP 2009-276504 a published Nov. 26, 2009.

* cited by examiner

*Primary Examiner* — Stewart Fraser
(74) *Attorney, Agent, or Firm* — Millen, White, Zelano & Branigan, P.C.

(57) ABSTRACT

A pellicle for lithography, in which an agglutinant layer is so controlled that the deformation of the pellicle frame is prevented from transferring to an exposure original plate to which the pellicle is attached so that pattern transferred scarcely undergoes deformation; in particular the agglutinant layer has a Young's modulus of 0.02 to 0.08 MPa and a tensile bond strength of 0.04 to 0.08 $N/mm^2$.

2 Claims, 1 Drawing Sheet

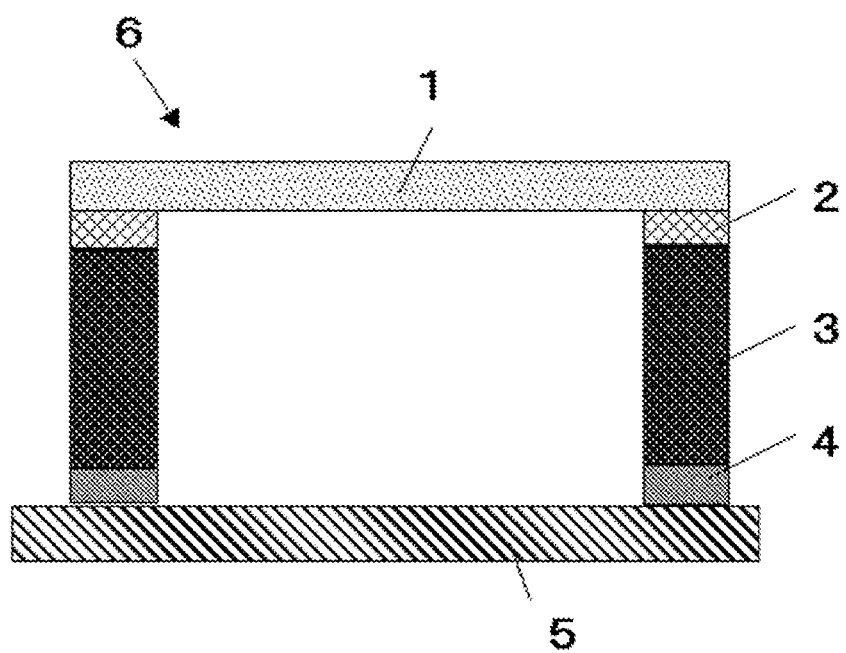

PELLICLE FOR LITHOGRAPHY

This application claims priority from Japanese Patent Application No. 2011-098074, filed on Apr. 26, 2011, the entire disclosure of which is hereby incorporated by reference.

FIELD OF THE INVENTION

The present invention relates to a pellicle for lithography, which is used to serve as a dust fender for a mask for lithography in the processes of manufacturing semiconductor devices such as LSI and super-LSI or in manufacturing a liquid crystal display board.

BACKGROUND OF THE INVENTION

In manufacturing semiconductor devices such as LSI and super-LSI or in manufacturing a liquid crystal display board or the like, a pattern is made by irradiating a light to a photosensitive resin coated on a semiconductor wafer or an exposure original plate for liquid crystal. However, if a dust adheres to the exposure original plate used in this pattern creating stage, the dust absorbs light or refracts it, causing deformation of a transferred pattern, roughened edges or black stains on a base, and leads to problems of damaged dimensions, poor quality, deformed appearance and the like. Incidentally, in the present specification, "exposure original plate" is a collective term of a mask for lithography (also simply referred to as "mask") and a reticle. Now, we will explain this by taking a mask for example.

The above-mentioned lithography works are usually performed in a clean room, but, even in a clean room, it is still difficult to keep the exposure original plate clean all the time, therefore, the light irradiation is carried out only after a surface of the exposure original plate is sheltered by a pellicle.

In general, a pellicle is built up of a pellicle frame and a pellicle membrane, where the latter is attached to the former in a slack-free manner. The pellicle membrane is made of cellulose nitrate, cellulose acetate and a fluorine-containing polymer or the like which transmit well such lights that are used in light exposure (e.g., g-line, i-line, KrF excimer laser, and ArF laser). To attach the pellicle membrane to the pellicle frame, a solvent that dissolves the pellicle membrane well is applied to one of the two annular faces (hereinafter referred to as "upper annular face") and, after pasting the pellicle membrane on it, the solvent and the membrane are dried by air flow, or alternatively an adhesive agent such as acrylic resin, epoxy resin and fluorine-containing resin is used to fix the pellicle membrane on the upper annular face of the pellicle frame.

Furthermore, on the other one of the two annular faces (hereinafter referred to as "lower annular face") is laid a mask-bonding agglutinant layer made of a polybutene resin, a polyvinyl acetate resin, an acrylic resin and a silicone resin or the like for attaching the pellicle frame to the exposure original plate, and on this agglutinant layer is laid a releasable liner for protecting the agglutinant layer.

A pellicle is set in a manner such that the pellicle frame entirely surrounds the pattern region formed in the surface of the exposure original plate; and as the pellicle is installed for the purpose of preventing the dust from adhering to the exposure original plate, the pattern region is isolated from the external atmosphere by means of the pellicle so that the dust outside the pellicle cannot reach the pattern region.

In recent years, the design rule for LSI has been updated to demand resolutions in the order of sub quarter-micron, and in order to attain such higher resolutions the light sources having shorter wavelengths have come to be adopted. In practice, mercury lamp lights such as g-line (436 nm) and i-line (365 nm), which have been predominantly adopted as the exposure light source are being replaced by KrF excimer lasers (248 nm) and ArF excimer lasers (193 nm). As the density of the pattern is increased thus, the demand for higher flatness of the mask and silicon wafer is strengthened too.

After a completion of a mask, a pellicle is attached to the mask so as to prevent dust from attaching to the pattern of the mask, but as the pellicle is attached to the mask, there is a possibility that the flatness of the mask is changed. When the mask flatness is worsened it is possible that problems such as defocusing take place. Also, a change in the flatness of the completed mask may cause a change in the shape of the pattern printed on the mask, which would result in a problem of poor mask overlay alignment accuracy.

In recent years, with regard to the flatness required for a mask, the current requirement of a flatness of 2 micrometers across the pattern face is being replaced by more strict preferred values such as 0.5 micrometer or flatter for 65 nm node and beyond, and an updated preference is to require 0.25 micrometer or flatter.

In general, when a pellicle with a pellicle frame whose flatness is inferior to that of a mask is attached to the mask, the flatness of the mask changes owing a phenomenon of flatness/deformation transfer. When the flatness of the mask is changed, the pattern printed on the mask is deformed, and thus the pattern to be transferred by the exposure light shall deform too so that the pattern's positioning accuracy is degraded. In general, the light exposure in the semiconductor manufacturing process is repeated as many times as the number of the pattern layers, so that when the pattern's positioning accuracy is bad, a problem occurs that the alignment with respect to each layer becomes inaccurate. Also, nowadays studies are being made to adopt a double patterning wherein one pattern is divided into two masks and light exposure is carried out twice, one for each mask, to cope with the necessity of exposing more dense patterns to light. In such a case, an inaccurate positioning caused by pattern deformation directly affects the pattern dimension.

The pellicle is attached to a mask via the agglutinant layer provided on the lower annular face of the pellicle frame, and as the pellicle is attached to the mask, the pellicle is usually pressed against the mask with a force of about 20 to 40 kgf. In general, the flatness of the mask is a few micrometers or less, and is 1 micrometer or less for a state-of-the-art lithography mask, while the flatness of the pellicle frame is generally in the order of several tens of micrometers, which is larger compared with the mask. Because of this, when the pellicle is attached to the mask, the flatness of the mask sometimes changes due to the unevenness of the frame. Hence, it is possible to minimize the extent of the change in the flatness of the mask by increasing the flatness of the pellicle frame as high as that of the mask.

A pellicle frame is usually made of an aluminum alloy. With regard to a pellicle frame for semiconductor lithography, it is in general rectangular with a width of 150 mm or so and a length of 110 to 130 mm or so, and is constituted by an endless frame bar having a rectangular cross-section. The frame is generally prepared by punching out a rectangular hole through an aluminum alloy plate or by extrusion-molding an aluminum material, but as the width of the frame bar is as narrow as 2 mm or so, it is liable to deform, so to produce a frame of high flatness is not easy. Because of this, it is very difficult to make a pellicle frame, which has a flatness of the same degree as that of the mask.

Also, the Young's modulus of an agglutinant which is used to make the agglutinant layer to effect adhesion between the pellicle and the mask is normally about 1 MPa, which is far smaller than the Young's modulus 72 GPa or so of aluminum alloys of which a pellicle frame is usually made, so that the agglutinant layer is by far softer than the pellicle frame. For this reason, the agglutinant layer absorbs the unevenness of the surface of the pellicle frame, and as a result, it is thought, the influence of the unevenness of the frame upon the mask is mitigated. The Young's modulus of conventional agglutinants are 1 MPa or so, but if an agglutinant having a smaller Young's modulus value, that is, a softer agglutinant is used, it should be possible to increase the absorption of the unevenness of the pellicle frame into the agglutinant layer.

The softness of the agglutinant layer determines not only the amount of the absorption of the unevenness of the pellicle frame, but also the amount of the load added when the pellicle is attached to the mask. In use of a pellicle, a risk of creating a local air pass between the mask and the agglutinant layer as well as a serious risk such as detachment of the pellicle from the mask must be avoided. To this end, the agglutinant layer, which is inferior to the mask in flatness like the pellicle frame is, is made flatter by being pressed under a load so as to realize an air pass-free adhesion to the mask. In this connection, it is noted that the softer the agglutinant is, the smaller the load required will be to realize an air pass-free adhesion between the mask surface and the agglutinant surface. Namely, by using a softer agglutinant the force required for closely contacting mask surface and agglutinant surface becomes smaller, thus it is possible to attach the pellicle to the mask while keeping the deformation of the pellicle frame minimum.

SUMMARY OF THE INVENTION

Technical Problem

Therefore, it is an object of the present invention to provide a pellicle for lithography which, when attached to an exposure original plate, substantially reduces the amount of the deformation of the exposure original plate caused by the deformation of the pellicle.

Solution to Problem

The above-stated object of the present invention was attained by a pellicle for lithography having an agglutinant layer, which is characterized in that the material for the said agglutinant layer is chosen from such that when an adhesion-assist load of 0.008 to 5 kgf including the weight of the pellicle is attached to the exposure original plate, no air pass is created.

This agglutinant layer to be used in the invention preferably has a Young's modulus of 0.01 to 0.1 MPa, a tensile strength of 0.02 to 0.1 $N/mm^2$, and a surface flatness of 0 to 15 micrometers.

Advantageous Effects of Invention

According to the present invention, it is possible to provide a pellicle for lithography, which can minimize the deformation of the exposure original plate caused by the deformation of the pellicle frame.

BRIEF DESCRIPTION OF DRAWINGS

FIG. 1 This is an example of conceptual cross-sectional view showing a structure of a pellicle of the present invention.

DESCRIPTION OF EMBODIMENTS

Now, the present invention will be explained by reference to the drawing.

FIG. 1 is a conceptual cross-sectional drawing indicating a structure example of the pellicle of the present invention. In FIG. 1, reference numeral 1 designates a pellicle membrane, 2 designates an adhesive layer, and 3 designates a pellicle frame, wherein the pellicle membrane 1 is attached to the pellicle frame 3 via the adhesive layer 2 in a slack-free manner. Reference numeral 4 designates an agglutinant layer for attaching the pellicle to the mask surface, 5 designates an exposure original plate (mask or reticle), and 6 designates a pellicle. Commonly a releasable liner (not shown) is detachably attached to the lower face of the agglutinant layer 4 for protecting the agglutinant layer, and this liner is detached immediately before the use of the pellicle. In addition, in the present invention, it is possible to provide a hole (vent pass) for pressure adjustment made through a bar of the pellicle frame 3, and also it is possible to provide a filter (not shown) at the pressure adjustment hole to prevent intrusion of particles, which exert a harmful influence on the patterning.

The sizes and materials of the constituent elements of the pellicle of the present invention may be the same as those of commonly used pellicles such as pellicles for semiconductor lithography and ones for lithography for making large-sized liquid crystal display boards, and can be arbitrarily selected from the sizes and materials already known.

As for the kind of pellicle membrane to be used in the present invention, there is no particular restriction, and for example, non-crystalline fluorine-containing polymers, which are adopted for conventional excimer laser, can be used. Examples of non-crystalline fluorine-containing polymer include CITOP (a commercial product manufactured by ASAHI GLASS CO., LTD.), TEFLON (registered trademark), and AF (a commercial product manufactured by Du Pont). Since these polymers are easily soluble in solvents such as fluorocarbon solvents, these polymers may be used, if needed, in the form of a solution dissolved in a solvent when the pellicle membrane is manufactured.

As for the material to constitute the pellicle frame, any known aluminum alloy may be used. In a case wherein an aluminum alloy is used, there is no particular restriction so long as a sufficient strength is secured as a pellicle frame, but in particular it is preferable to use JIS A7075, JIS A6061, JIS A 5025, etc.

In the present invention, it is preferable that the surface of the pellicle frame is roughened by a known method such as sand blasting and chemical abrasion before the pellicle frame receives adhesive agent and others. In the present invention, a method for roughening the surface of the frame may be selected from any of conventionally known ones, but in the case of an aluminum alloy frame, it is preferable to employ a method wherein the surface is blasted with beads of stainless steel, carborundum, or glass, and then polished with a chemical such as NaOH, whereby the surface is roughened.

An agglutinant to make the agglutinant layer 4 of the pellicle of the present invention should be one such that the appropriate adhesion-assist load including the pellicle's self weight, when the pellicle is attached to the exposure original plate, becomes 0.008 to 5 kgf. When the load exceeds 5 kgf, the deformation of the pellicle is so large that it becomes a cause of the deformation of the mask pattern. The type of agglutinant can be selected from known types of agglutinant as appropriate, but it is preferable in the present invention to use acrylic resin agglutinant and a silicone-based agglutinant; and so long as the function expected as the agglutinant is secured, it is possible to use these resins on their own or in mixture of two or more.

An agglutinant to make the agglutinant layer, through which the workable adhesion-assist load of 0.008 to 5 kgf including the self-weight of the pellicle is added on the exposure original plate, would preferably have a Young's modulus of 0.01 to 0.10 MPa, or more preferably 0.02 to 0.08 MPa. If its Young's modulus is smaller than 0.01 MPa, the strength of the agglutinant layer is insufficient, therefore, the pellicle may move from the predetermined position. On the other hand, if the agglutinant layer's Young's modulus is greater than 0.10 MPa, the layer may not acquire sufficient flexibility to absorb the unevenness of the frame surface.

The tensile bond strength of the agglutinant layer is preferably 0.02 to 0.1 $N/mm^2$, and more preferably 0.04 to 0.08 $N/mm^2$. If the tensile bond strength is smaller than 0.02 $N/mm^2$, the pellicle may be detached from the exposure original plate since the pellicle receives an acceleration shock during light exposure process or transportation. On the other hand, if the tensile bond strength is greater than 0.10 $N/mm^2$, a strong bonding strength is created along the surface of the frame, which is not even, and this may impart localized stress to the mask to cause the deformation of the mask.

Incidentally, in the present invention, the Young's modulus and the tensile bond strength of the agglutinant layer are calculated from the agglutinant layer's elongation (distortion) and its stress measured by means of a tensile test wherein a mask to which a pellicle is attached is fixed and one of the frame bars of the pellicle is pulled in a direction vertical to the mask at a velocity of 0.1 mm/sec.

It is preferable that the flatness of the surface of the agglutinant layer in the pellicle of the present invention is 15 micrometers or less. If the agglutinant layer's surface has such an unevenness exceeding the flatness of 15 micrometers, a localized stress is created when the pellicle is attached to the mask, whereby the mask is distorted. Incidentally, the "flatness values" in this specification are in terms of total thickness variation as defined in ASTM F657. In particular, the heights (latitude) of the agglutinant layer were measured at the four corners of the pellicle frame on which the agglutinant layer had been laid as well as at the four middle points of the four frame bars, and an imaginary standard plane was predetermined by calculation and the largest value of the distances of the eight points from the imaginary standard plane was subtracted by smallest of the same and the resulting value was determined as the flatness. For the purpose of this, "a laser beam displacement gauge having an X-Y program stage" was used. In the present invention, the displacement sensor used was made by the applicants' company.

Now, the present invention will be explained with reference to examples, but it should be understood that the present invention is not to be construed as being limited in any way thereby. Also, in the examples and comparative examples, the "mask" is meant only as an example of "exposure original plate", and the invention is applicable to a reticle as well. Also, in the comparative examples as well as the examples of the present invention, the pellicle frames of 149 mm×122 mm, having 3.5 mm in bar width and 2 mm in bar height, were used. The flatness of the lower annular face to bear the agglutinant was 20 micrometers.

Example 1

After a pellicle frame was cleansed in pure water, a syringe was filled with an acrylic agglutinant SK-Dyne 1495 (a commercial product manufactured by Soken Chemical & Engineering Co., Ltd.), to which a curing agent had been added, and the agglutinant was dispensed onto the lower annular face of the cleansed frame. Then, the agglutinant was cured at 140° C. for 30 minutes to obtain the agglutinant layer having a flatness of 10 micrometers.

Then, on the upper annular face of the pellicle frame was coated an adhesive agent of CITOP CTX-A (a commercial product manufactured by ASAHI GLASS CO., LTD.), and the pellicle frame was heated at 130° C. whereby the adhesive agent was cured.

Thereafter, the upper annular face of the pellicle frame was bonded to a preformed pellicle membrane, which was attached to and supported by a temporary frame having a greater size than the pellicle frame, and subsequently the portion of the pellicle membrane which extended beyond the outer edge of the pellicle frame was removed and a pellicle was completed. This pellicle was attached to a mask using an adhesion-assist load of 5 kgf, including the pellicle weight.

Example 2

After a pellicle frame was cleansed in pure water, an acrylic agglutinant SK-Dyne 1425 (a commercial product manufactured by Soken Chemical & Engineering Co., Ltd.) and SK-Dyne 1495 (ditto) were mixed in an even ratio, and a curing agent was added to the mixture before the mixture was put in a syringe. Then, the agglutinant was dispensed from the syringe onto the lower annular face of the cleansed pellicle frame. Then, the agglutinant was cured at a 140° C., for 30 minutes to make the surface flatness of the agglutinant layer as 15 micrometers.

Thereafter, a pellicle was completed in the similar manner to in Example 1 and the resultant pellicle was attached to a mask using an adhesion-assist load of 5 kgf, including the pellicle weight.

Example 3

After a pellicle frame was cleansed in pure water, SK-Dyne 1495 and SK-Dyne 1425, which were used in the Example 2, were mixed in a ratio of 1 to 3, and a curing agent was added to the mixture before the mixture was put in a syringe. The agglutinant was dispensed from the syringe onto the lower annular face of the cleansed pellicle frame. Then, the agglutinant was cured at a 140° C., for 30 minutes to make the surface flatness of the agglutinant layer as 15 micrometers.

Thereafter, a pellicle was completed in the similar manner to in Example 1 and the resultant pellicle was attached to a mask using an adhesion-assist load of 2 kgf, including the pellicle weight.

Comparative Example 1

In the similar manner to in Example 1, a pellicle was made such that the surface flatness of its agglutinant layer was 20 micrometers, and the pellicle was attached to a mask using an adhesion-assist load of 25 kgf, including the pellicle weight.

Comparative Example 2

After a pellicle frame was cleansed in pure water, a syringe was filled with K-Dyne 1425, to which a curing agent had been added, and the agglutinant was dispensed onto the lower annular face of the cleansed pellicle frame. Then, the agglutinant was cured at a 140° C. for 30 minutes to make the surface flatness of the agglutinant layer as 20 micrometers.

Then, in the similar manner to in Example 1, a pellicle was completed, and the pellicle was attached to a mask using an adhesion-assist load of 5 kgf, including the pellicle weight.

Comparative Example 3

After a pellicle frame was cleansed in pure water, a syringe was filled with an acrylic agglutinant SK-Dyne 1499 (a commercial product manufactured by Soken Chemical & Engineering Co., Ltd.), to which a curing agent had been added, and the agglutinant was dispensed onto the lower annular face of the cleansed pellicle frame. Then, the agglutinant was cured at a 140° C. for 30 minutes to make the surface flatness of the agglutinant layer as 20 micrometers.

Then, a pellicle was completed in the similar manner to in Example 1, and the resultant pellicle was attached to a mask using an adhesion-assist load of 5 kgf, including the pellicle weight.

The flatness of each mask before and after being attached to by the respective pellicles made in Examples 1 to 3 and Comparative Examples 1 to 3 were measured with FlatMaster (a commercial product manufactured by Tropel Corporation). The difference between the heights before and after the adhesion at several points on both sides of each mask was measured and the greatest absolute values on either side of the mask were added up to obtain the mask's maximum change range. Incidentally, when a mask is deformed as a result of pellicle adhesion, the greatest change range may amount to a large value even when the flatness value is not changed, so that as an index for mask deformation/distortion, the maximum change range is more eloquent than the flatness value.

Later, these masks were put in an oven at 80° C., for 72 hours, and the adhesion stability, air pass creation and pellicle misplacement due to its creeping were inspected.

Also, in a separate experiment, pellicles made in the same manners as the examples, were tested as they were detached from the masks to obtain the tensile strength and the elongation of the agglutinant layers and from these values the Young's modulus of each agglutinant was obtained. The results were shown in Table 1.

TABLE 1

| | flatness of agglutinant layer's surface (μm) | Young's modulus (MPa) | tensile bond strength (N/mm$^2$) | adhesion-assist load (kgf) | maximum change range (nm) | adhesion stability | |
|---|---|---|---|---|---|---|---|
| | | | | | | air pass? | misplacement? |
| Example 1 | 10 | 0.033 | 0.049 | 5 | 35 | none | no |
| Example 2 | 15 | 0.071 | 0.072 | 5 | 40 | none | no |
| Example 3 | 15 | 0.088 | 0.098 | 5 | 50 | none | no |
| Comparative Example 1 | 20 | 0.033 | 0.049 | 25 | 80 | none | no |
| Comparative Example 2 | 20 | 0.114 | 0.144 | 5 | 70 | two | no |
| Comparative Example 3 | 20 | 0.008 | 0.028 | 5 | 60 | none | yes |

It is seen from Table 1 that the pellicle of the present invention was proved to mitigate the mask deformation while avoiding the creation of air pass and the pellicle displacement.

INDUSTRIAL APPLICABILITY

The pellicle of the present invention is capable of mitigating the deformation of the exposure original plate attributable to the deformation of the pellicle, thus the present invention is very useful in the industry.

EXPLANATION OF REFERENCE NUMERAL

1: pellicle membrane
2: adhesive layer
3: pellicle frame
4: agglutinant layer
5: exposure original plate
6: pellicle

What is claimed is:

1. A pellicle for lithography comprising a frame, a membrane, and an agglutinant layer for attaching the pellicle frame to an exposure original plate, wherein the said agglutinant layer has a Young's modulus of 0.01 to 0.10 MPa, a tensile bond strength of 0.02 to 0.10 N/mm$^2$, and a surface flatness of 0 to 15 micrometers and wherein said agglutinant layer is provided such that when an adhesion-assist load of 0.008 to 5 kgf, including the weight of the pellicle, is applied for the pellicle to adhere to the exposure original plate, no air pass is created.

2. A pellicle for lithography according to claim 1, wherein said agglutinant layer has a Young's modulus of 0.02 to 0.08 MPa and a tensile bond strength of 0.04 to 0.08 N/mm$^2$.

* * * * *